United States Patent [19]

Truskalo et al.

[11] Patent Number: 5,111,119
[45] Date of Patent: May 5, 1992

[54] SCAN LOSS DETECTOR FOR CATHODE RAY TUBE

[75] Inventors: Walter Truskalo, Indianapolis; Marvin N. Norman, Noblesville, both of Ind.

[73] Assignee: Thomson Consumer Electronics, Inc., Indianapolis, Ind.

[21] Appl. No.: 701,737

[22] Filed: May 17, 1991

[51] Int. Cl.$^5$ .......................... G09G 1/04; H01J 29/70
[52] U.S. Cl. .................................... 315/386
[58] Field of Search ............................... 315/386, 384

[56] References Cited

U.S. PATENT DOCUMENTS 3,963,961  6/1976  Ray et al. ........................... 315/379
5,036,260  7/1991  George ............................... 315/384

OTHER PUBLICATIONS

U.S. patent application, Ser. No. 516,386 entitled Self Biasing Protection Arrangement For A Cathode Ray Tube, in the name of John Barrett George.

Primary Examiner—Gregory C. Issing
Attorney, Agent, or Firm—Joseph S. Tripoli; Joseph J. Laks; Sammy S. Henig

[57] ABSTRACT

An active amplifier is responsive to a vertical parabola voltage developed across a trace or S-shaping capacitor for developing a DC voltage at an increased voltage level than can be obtained by rectifying the parabola voltage. The increased voltage level is developed in a capacitor, during part of the period of each scan. The capacitor is discharged through a parallel resistor. During normal scanning, the capacitor voltage, alternately, increases and decreases, but remains above a threshold level as detected by a comparator. Upon scan loss, the capacitor discharges below the threshold and the comparator triggers blanking of the kinescope driver. In this way, the phosphors of a cathode ray tube of a television, especially a projection television, are protected from burning due to a loss of electron beam deflection.

19 Claims, 3 Drawing Sheets

SCAN LOSS DETECTOR FOR CATHODE RAY TUBE

This invention relates to video display apparatus and in particular to a cathode ray tube (CRT) protection circuits operating to detect and respond to deflection loss which otherwise may cause burning of the CRT screen phosphors.

Projection video display apparatus, such as television receivers, normally include three monochrome cathode ray tubes (CRTs) which individually produce red, green and blue images. The images are enlarged and overlaid as they are projected onto a screen. In order to form a final enlarged image of sufficient brightness to be acceptable under normal room lighting conditions, it is desirable to operate the individual cathode ray tubes at high brightness levels, i.e., at high electron beam current density.

The requirement of high beam current density results in a danger of damage to the phosphors on the CRT screens. Loss or reduction of horizontal or vertical deflection or scan in any or all of the cathode ray tube electron beams will cause an undesirable concentration of electron beam energy over a small region of the phosphors on one or more of the CRT screens. An undue concentration of energy may cause permanent damage to the CRT screen if the scan loss or reduction condition persists even for a short time. The problem is acute when horizontal or vertical scan loss occurs, and the scanning is reduced to a spot or line (i.e., no vertical and/or horizontal deflection), which produces a permanent variation in the light output of the affected phosphors of the CRT.

Deflection is driven by scanning rate currents in the electromagnetic deflection yokes which encompass the electron beam path. Various conditions can cause a loss of deflection, such as a component defect in the driving circuitry for the yokes, or an open circuit in the connections between the drivers and the respective yokes. Whereas three vertical deflection coils for the three CRTs may be connected serially, a plurality of connectors may be involved in coupling the vertical deflection current to the coils. Should any of these connectors be improperly engaged or their conductors shorted, for example during assembly or servicing, all three CRTs might be damaged.

The CRTs are one of the more expensive elements of a projection television apparatus, and replacing a CRT is a substantial repair job. To protect the CRT screens from damage, it is important to provide some form of protection that can sense and promptly respond to a loss or reduction of electron beam deflection in an appropriate manner, for example by quickly blanking the concentrated electron beam or beams before the screen is damaged.

U.S. Pat. No. 4,642,532—Hoover discloses a projection television deflection loss protection circuit wherein signals representative of vertical and horizontal deflection currents are sensed. In the event of a loss of either of the horizontal or vertical deflection current, a signal is generated and used to trigger blanking of the display by disabling the kinescope (kine) driver.

U.S. patent application Ser. No. 515,513, filed Apr. 30, 1990—George, entitled A PROTECTION CIRCUITS FOR A CATHODE RAY TUBE, discloses a scan loss protection apparatus wherein the voltage across the vertical trace capacitor (or S-shaping capacitor) provides an input to a comparator for detecting a loss of vertical deflection current. The trace capacitor is coupled in series with the vertical deflection coil. The current in the deflection coils is substantially a sawtooth. The voltage across the trace capacitor is a parabola at the vertical scanning rate. This parabola is AC coupled to a rectifier and the output of the rectifier charges a capacitor and defines an input to a voltage comparator. When vertical deflection current is lost, the capacitor discharges through a parallel resistance, defining an R-C time constant, and the signal input to the comparator falls below the reference level to trigger blanking.

The comparator signal input has a component at the vertical scanning frequency, as a result of the capacitor being slightly discharged and then charged in each vertical deflection cycle, and also a DC offset or average value. It may be desirable to set the reference level of the comparator, which is a DC level, far enough below the normal minimum level of the signal input to the comparator to avoid false triggering of the scan loss circuit. Specifically, the threshold should be, preferably, lower than the normal minimum level by an amount, defining a guard band or noise margin. The guard band should be, preferably, sufficient to prevent normal variations such as noise on the signal input to the comparator, typical variations in the peak amplitude of the deflection drive signal from nominal and typical decrease in the capacitor voltage during a portion of the deflection cycle from causing triggering of the scan loss circuit. Upon loss of scan the capacitor discharges from its maximum voltage, occurring at the beginning of each cycle, through the normal operational span of the discharging capacitor, and further through the guard band to reach the threshold of the comparator. A reaction time of the scan loss detector is defined from a time the deflection current is lost to the time CRT blanking occurs. The reaction time is determined by the R-C time constant, the signal voltage level and the difference between the signal voltage level and the threshold.

In accordance with an aspect of the invention, to reduce the reaction time of a scan loss detector of the type discussed, an active amplifier is interposed between the source of a deflection signal, and the accumulating capacitor associated with the comparator. The deflection signal, such as the voltage across the trace or S-shaping capacitor, is amplified in the amplifier that causes an increase in the voltage level developed across the capacitor during part of the period of each scan. The capacitor is discharged during the other part of each period through a parallel resistor.

So long as vertical scanning continues, the capacitor voltage increases and decreases, alternately, in the corresponding parts of each vertical deflection cycle, but remains above a threshold level as detected by a comparator. Upon scan loss, the capacitor discharges and the capacitor voltage ramps through the guard band below the threshold and the comparator triggers blanking of the kinescope driver.

The active amplifier, which advantageously is a current pulse generator is coupled between, for example, a positive supply voltage and the capacitor and is responsive to negative peaks in a parabola derived from the trace capacitor. The amplifier produces a voltage in the capacitor that is higher than is possible by merely rectifying the deflection signal. The higher capacitor voltage enables using a shorter time constant, resulting in a quicker capacitor discharge through a guard band, between the normal operational minimum capacitor voltage in each deflection cycle and the threshold. Advantageously, the peak capacitor voltage level does not significantly vary with the amplitude of the deflection signal, making the response time less dependent on the amplitude of the deflection signal.

A video display apparatus, embodying an aspect of the invention includes a cathode ray tube having an evacuated glass envelope. A display screen is disposed at one end of the envelope and an electron gun assembly is disposed at a second end of the envelope. The electron gun assembly produces an electron beam that forms a raster at electron beam landing locations on the screen. A deflection current is generated in a deflection winding that is disposed on the cathode ray tube for producing a deflection field in a beam path of the electron beam. A deflection signal is generated at an amplitude that is related to an amplitude of the deflection current. A comparator is responsive to a second signal for generating an output signal that is coupled to an electrode of the cathode ray tube to provide beam current blanking when a scan loss condition occurs. An active amplifier has an input responsive to the deflection signal for generating the second signal by amplifying the signal that is developed at the input of the amplifier.

Figure 1:
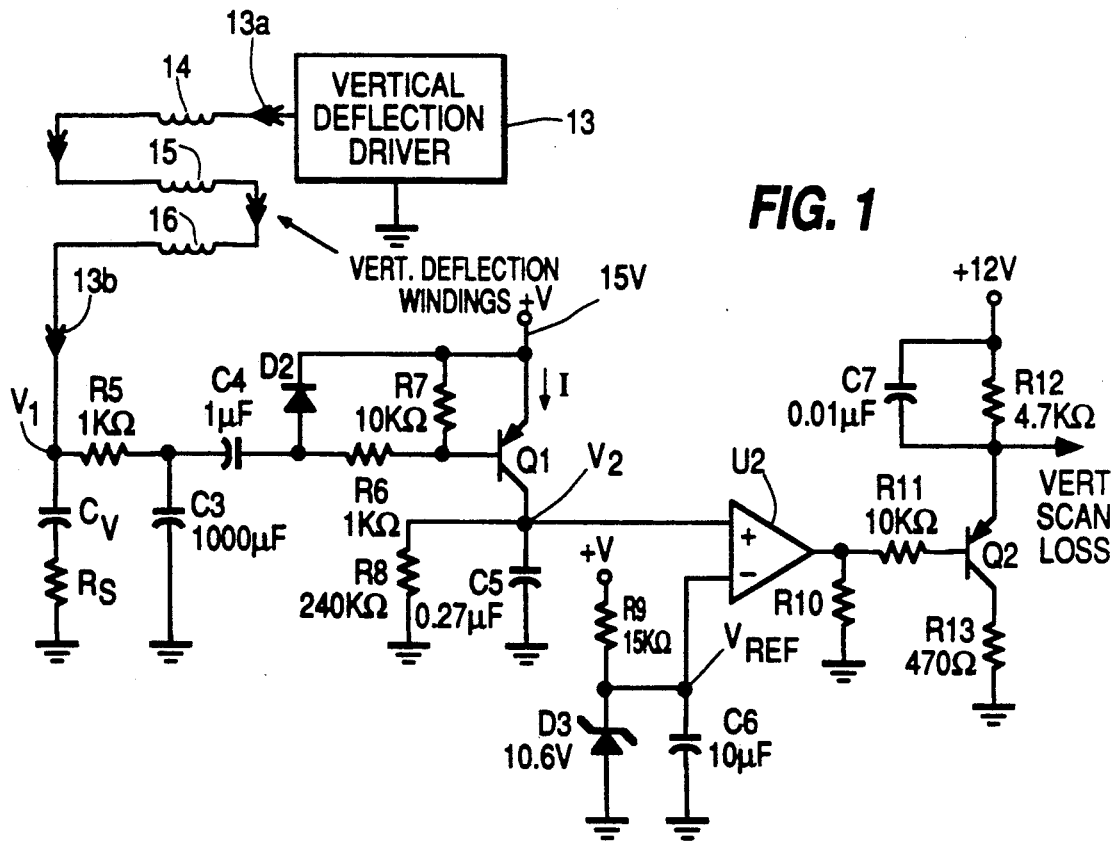
FIG. 1 illustrates a block diagram, embodying an aspect of the invention, as applied to a vertical scan loss detection.

Referring to FIG. 1, a projection type video display apparatus, such as a television receiver, incorporates three monochrome CRTs or kinescopes 10, 11 and 12. Kinescope 10 produces red images; kinescope 11 produces green images; and kinescope 12 produces blue images. The three images are combined by an optical system (not shown) on a viewing screen, where they are viewed by the user as a composite color image.

Vertical deflection windings 14, 15 and 16 are coupled in series between an output terminal 13a of a vertical deflection driving circuit 13 and a terminal 13b. A DC blocking capacitor Cv and a current sampling resistor Rs are coupled in series with the deflection windings 14, 15, 16, between terminal 13a and ground. Circuit 13 produces a sawtooth vertical deflection current that flows into capacitor Cv to produce a vertical rate signal $V_1$ at terminal 13b. During normal operation the vertical rate signal $V_1$ includes a parabolic voltage component. Should a vertical scan loss occur, for example when any one of the windings 14, 15, 16 becomes an open circuit or when continuity is lost across terminals 13a, 13b or one of the intermediate connections, the parabolic signal $V_1$ does not develop.

An output stage, not shown, drives horizontal scanning at the line rate, via horizontal deflection windings 20, 21, 22. The horizontal output stage may include a flyback or high voltage transformer, not shown, with secondary windings providing power for the various load circuits, including an approximately +225 VDC supply voltage which is DC coupled for driving the cathodes of CRTs 10, 11 and 12.

The vertical parabola signal $V_1$, that is at about 2.5 volts peak-to-peak, is slightly integrated by series resistor R5 and parallel capacitor C3, and AC coupled via capacitor C4 to an amplifier, embodying an inventive feature, including a PNP transistor Q1. The signal is coupled to the base of transistor Q1 through series resistor R6, and the base of transistor Q1 is biased relative to the positive DC supply voltage +V, for example +15 VDC. A diode D2 clamps the parabola to positive supply voltage +V, and while the parabola signal is positive transistor Q1 does not conduct. The emitter of PNP transistor Q1 is coupled to the positive supply V+. During the negative tips of the parabola, i.e., during narrow pulse intervals at the edges of the scan in the vicinity of vertical retrace, transistor Q1 conducts from the positive supply, to charge capacitor C5.

Figure 4:
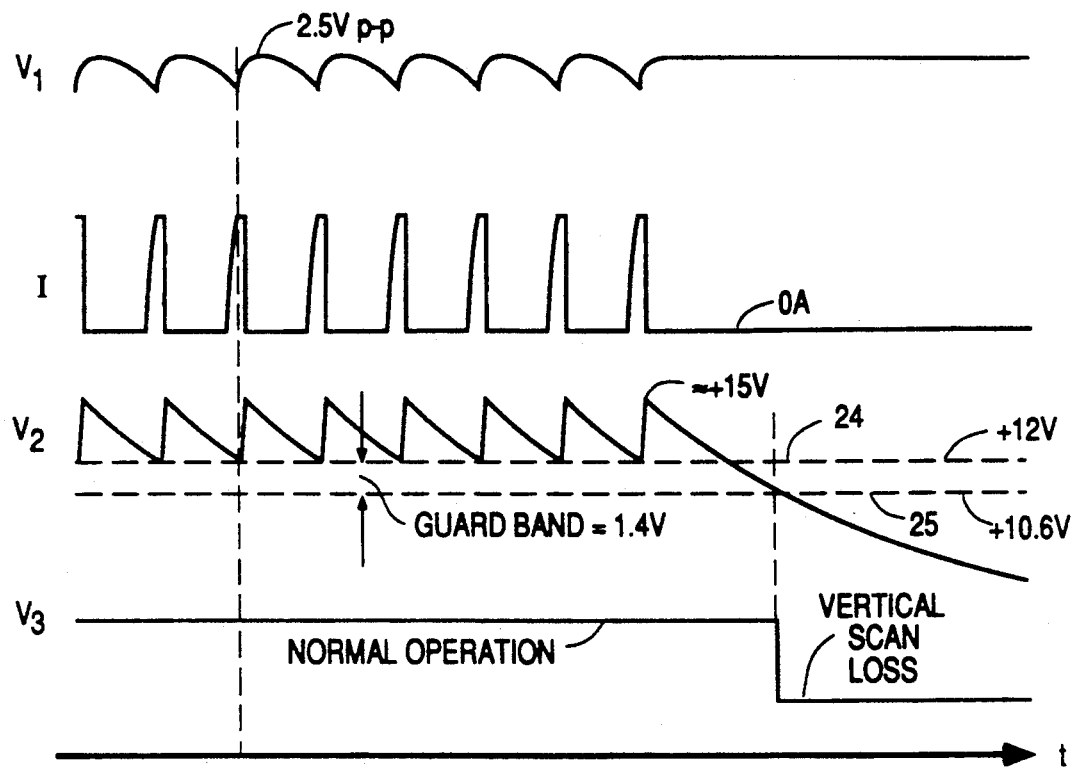
FIG. 4 is a timing diagram showing operation of the invention according to FIG. 3.

The current through transistor Q1 and the voltage across capacitor C5 are shown in FIG. 4 as I and $V_2$, respectively. Similar symbols and numerals in FIGS. 1 and 4 indicate similar items or functions.

During the intervals current pulses flow through transistor Q1 of FIG. 1, the peak of a voltage $V_2$ of FIG. 4 across capacitor C5 rises nearly to the level of the positive supply voltage V+. Following a given current pulse, voltage $V_2$ across capacitor C5 of FIG. 1 is drained away through parallel resistor R8. Voltage $V_2$ across capacitor C5 is coupled to one input of a voltage comparator including operational an amplifier U2. The other input to the comparator is coupled to a reference voltage $V_{REF}$ defining the threshold of the comparator. In the example according to FIG. 1, the reference voltage is defined by a reverse biased zener diode D3, coupled to the positive supply through a resistor R9 and to a parallel capacitor C6. Where the supply voltage is +15 volts the reference is appropriately set at about 10.6 volts.

So long as normal vertical scanning continues, a new current pulse from transistor Q1 arrives to recharge capacitor C5 before it discharges to the threshold of comparator U2. If, due to a fault, the AC input from the trace capacitor Cv is lost, and no new pulse arrives, the output of the comparator changes state as voltage $V_2$ on capacitor C5 drops below the reference voltage. A vertical scan loss signal VERTICAL SCAN LOSS is then generated through a driver transistor Q2. The base of transistor Q2 is coupled to the comparator output through series resistor R11 and biasing resistor R10. When the output of the comparator goes low (i.e., when the reference voltage coupled to the inverting input of operational amplifier U2 is higher than the voltage across capacitor C5 coupled to the noninverting input), PNP transistor Q2 conducts. Transistor Q2 is arranged as a follower amplifier, the output at the emitter of transistor Q2 being coupled to a positive supply voltage through a resistor R12 and a capacitor C7, and the collector being coupled to ground through a resistor R13. During normal operation, the output at the emitter of transistor Q2 is at about +12 volts, and upon scan loss the output goes to zero.

Figure 3:
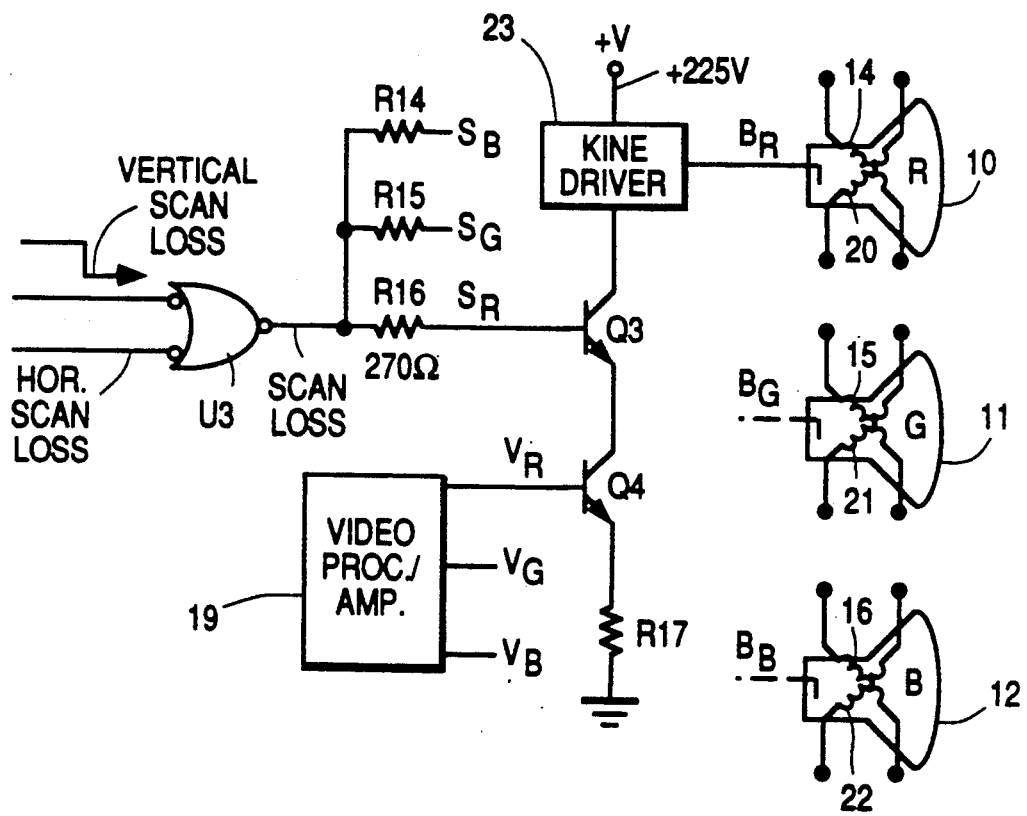
FIG. 3 is a block diagram showing application of the scan loss detector of FIG. 1 or 2 to disable operation of a video display (kine) driver upon detection of vertical scan loss.
Figure 5:
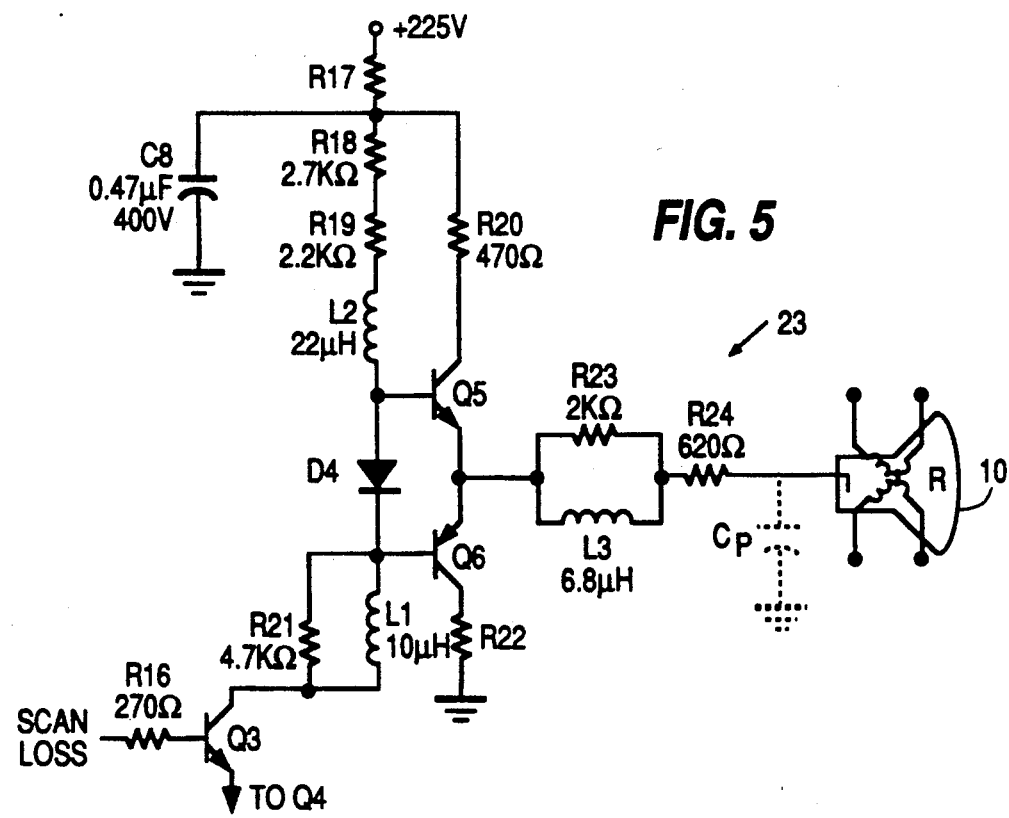
FIG. 5 is a schematic diagram showing coupling of the scan loss detection circuit to a kinescope driver.

Scan loss signal VERTICAL SCAN LOSS from transistor Q2 is coupled to an arrangement for blanking the display by disabling generation of the electron beam current, as shown in FIGS. 3 or 5. Similar symbols and numerals in FIGS. 1 and 3-5 indicate similar items or functions.

Referring to FIG. 3, the beam current is normally generated by kinescope driver 23, in response to the output of video processor/amplifier 19, which decodes and amplifies the video signal received from an antenna, or some other source. The output of the video processor 19, for example, controllably causes a cathode electrode current of the CRT to flow via kinescope driver 23 and via a transistor Q4, whose emitter is coupled to ground through resistor R17. Separate kinescope drivers 23 and transistors Q4 are provided for the respective CRTs 10, 11, 12, only one being shown in the drawing.

Each of the three kinescope drivers is coupled to its respective transistor, Q4, through a corresponding switching transistor, Q3, in a cascode amplifier configuration of transistors Q4 and Q3. Transistor Q3 for each CRT has a base coupled to scan loss signal VERTICAL SCAN LOSS through one of resistors R16, R15 or R14. Provided transistor Q3 is conducting (i.e., in the absence of a low level indicating scan loss on the base of Q3), video signals VR, VG and VB produced by video processing stage 19 and coupled to the bases of each respective transistor Q4 are coupled to the appropriate kinescope driver 23 and electron beam current is provided to the CRT cathode.

FIG. 5 illustrates in more detail a conventional output kinescope driver stage 23 to be driven from the video processor/amplifier 19 through transistors Q4 and Q3. Similar symbols and numerals in FIGS. 1 and 3–5 indicate similar items or functions. Stage 23 of FIG. 5 includes a series arrangement formed by an inductor L1, a diode D4, an inductor L2, a resistor R19 and resistor R18. This series arrangement forms a collector load at the collector of transistor Q3 (and, through transistor Q3, at the collector of transistor Q4). A high level amplified video signal is developed at the collector of transistor Q3, provided it is conducting. The output of the driver stage includes opposite conductivity type emitter follower transistors Q5 and Q6, forming a Class B amplifier with base inputs coupled to the collector of transistor Q3 across diode D4. The emitter output of transistor Q5 is coupled to the emitter output of transistor Q6. The high level amplified video signal is coupled from the emitter output of PNP follower transistor Q6 or of NPN follower transistor Q5, which corresponds to an output terminal of the driver stage, to a cathode electrode of the image reproducing kinescope or CRT 10, via a kinescope arc current limiting resistor R24 and peaking circuitry including resistor R23 and inductor L3. A collector resistor R22 coupled to transistor Q6 acts as a kinescope arc current limiting resistor.

Kine supply voltage is provided at approximately +225 volts through resistors R17 and R20 to the collector of transistor Q5, and is coupled to the series arrangement including resistors R18, R19, also through R17. A filter capacitor C8 is coupled to the junction of resistors R17 and R18.

When a user turns off the power to the television receiver, for example by disconnecting the mains supply voltage, deflection loss occurs and the voltage of signal VERTICAL SCAN LOSS goes to near zero. Accordingly, transistor Q3 becomes nonconductive. So long as the kine supply voltage remains positive (e.g., from stored charge in the receiver's filter capacitor), a positive cathode voltage is maintained in the CRT. The control grid voltage of the CRT can be maintained at a less positive level, and the voltage difference between the cathode and the control grid causes a beam current cutoff condition wherein the beam current is substantially zero. In this manner CRT 10 is protected from phosphor damage even if the ultor voltage is sufficiently large to produce a beam current.

Whether a scan loss occurs when power to the television is turned on, or when the user turns off the power to the television such that the kine supply voltage falls off but the ultor voltage remains high, transistors Q3 and Q6 remain nonconductive to disable beam current emission. A conventional grid biasing and cutoff circuit, not shown, may be provided as a redundant means operable in addition to the scan loss circuits.

As shown schematically by an OR gate U3 in FIG. 3, a scan loss signal can be generated in the event of deflection failure in either or both of the vertical and horizontal scanning circuits. Although only the generation of the vertical scan loss signal is discussed in detail, a horizontal scan loss signal HOR. SCAN LOSS can be generated in a well known manner when horizontal scan loss occurs.

In accordance with an inventive feature, the peak voltage level of voltage $V_2$ of FIG. 4 developed across integrating capacitor C5 of FIG. 1, which discharges during a substantial portion of vertical trace, is substantially greater than the amplitude of input signal $V_1$. According to the embodiment of FIG. 1, the peak level of voltage $V_2$ in capacitor C5 is approximately equal to the power supply voltage $V+$, and is related to the input parabola in that the capacitor is charged to the supply voltage, during the minimum peaks of the parabola, in the vicinity of vertical retrace. By providing this large voltage across capacitor C5, a shorter time constant can be utilized than without voltage amplification that is obtained by transistor Q1. This can be appreciated with respect to FIG. 4.

Voltage $V_2$ of FIG. 4 across capacitor C5 decays from its peak level of about +15 volts to a normal operational minimum level 24 of +12 volts during every normal operation vertical scan interval, at a rate defined by the values of capacitor C5 and the parallel resistance defined by resistor R8 and the input impedance of the comparator U2 (which is normally large for an operational amplifier comparator as shown). In the illustrated example, the time constant $\tau$ is about 65 msec. (240 K×0.27 $\mu$F=64.8 msec). A threshold level 25 of comparator U2 of 10.6 volts is lower than the normal operational minimum level 24 of voltage signal $V_2$, by an amount defining a guard band. The guard band allows a certain normal variation in the normal operational minimum level 24, without triggering the output of the comparator U2. In connection with a supply voltage of 15 volts, the minimum operational level 24 is, for example, about 12 volts, and the threshold level is set at about 10.6 volts to provide a guard band of 1.4 volts.

When a scan loss occurs, voltage $V_2$ decays through its usual span of discharge of capacitor C5, and also through the guard band. The decay through the guard band is a continuation of the usual operational decay, and approximately at the same characteristic rate. If the difference between the peak of voltage $V_2$ and voltage $V_{REF}$ were significantly smaller, the selected slope of the decay would have had to be also significantly lower, due to discharge from a lower voltage difference during approximately the same interval. Therefore, after scan loss occurs, the decay of voltage $V_2$ through the guard band to the threshold level $V_{REF}$ would be longer. Accordingly, the higher voltage difference produced by amplifying signal $V_1$ in the amplifier has the beneficial result of allowing using a shorter time constant, a steeper slope, and, therefore, a quicker detection of a scan loss.

Figure 2:
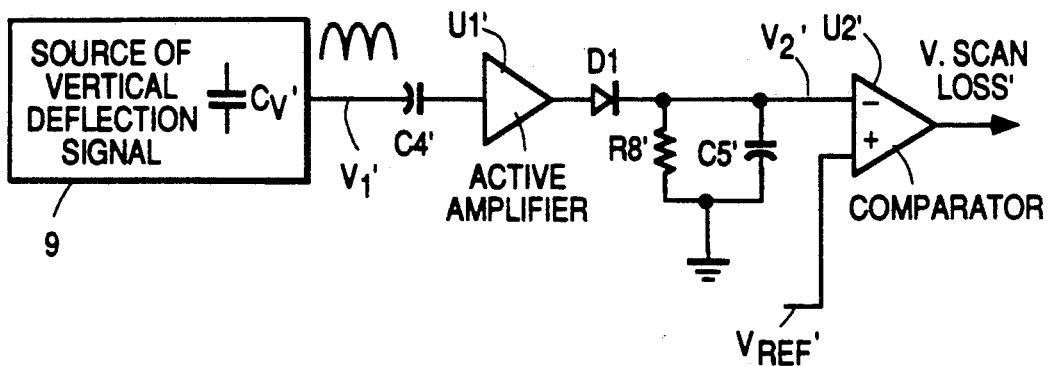
FIG. 2 is a circuit diagram showing a vertical scan loss detector, embodying another aspect of the invention.

FIG. 2 illustrates a second embodiment of the invention. Similar symbols and numerals in FIGS. 1-5 indicate similar items or functions. Referring to FIG. 2, to prevent damage to the phosphors in the event of a loss of scanning, parabolic voltage $V_1'$ of the AC deflection signal is AC coupled to an active amplifier U1. The amplifier U1 has a positive gain or amplification. The higher gain signal at the output of amplifier U1 is rectified by a peak detector diode D1, and applied to an integrating capacitor C5'. The voltage level on capacitor C5' is compared to a threshold voltage $V_{REF}'$. Capacitor C5' is coupled to parallel resistance R8', which discharges the capacitor over time. So long as the AC signal representing deflection remains present, the capacitor voltage remains above the threshold of comparator U2. When the AC signal is lost, the capacitor discharges through the parallel resistance. The capacitor and the parallel resistance have a time constant short enough such that, when scan loss occurs, the voltage level across the capacitor falls below the threshold before the phosphors on the screens of the CRTs 10, 11, 12, can be burned. The time constant is long enough such that the capacitor does not discharge below the threshold during normal operation. The output of comparator U2 enables or disables the supply of current to the CRT cathode via the kinescope driver, as explained before.

What is claimed is:

1. A video display apparatus, comprising:
   a cathode ray tube including an evacuated glass envelope, a display screen disposed at one end of said envelope and an electron gun assembly disposed at a second end of said envelope, said electron gun assembly producing an electron beam that forms a raster at electron beam landing locations on said screen;
   means for generating a deflection current in a deflection winding that is disposed on said cathode ray tube for producing a deflection field in a beam path of said electron beam;
   means coupled to said deflection current generating means for generating a parabolic deflection signal at an amplitude that is related to an amplitude of said deflection current;
   a comparator responsive to a second signal for generating an output signal that is coupled to an electrode of said cathode ray tube to provide beam current blanking when a scan loss condition occurs; and
   an active amplifier having an input responsive to said parabolic deflection signal for generating said second signal by amplifying the signal that is developed at said input of said amplifier.

2. A video display apparatus, comprising:
   a cathode ray tube including an evacuated glass envelope, a display screen disposed at one end of said envelope and an electron gun assembly disposed at a second end of said envelope, said electron gun assembly producing an electron beam that forms a raster at electron beam landing locations on said screen;
   means for generating a deflection current in a deflection winding that is disposed on said cathode ray tube for producing a deflection field in a beam path of said electron beam;
   means coupled to said deflection current generating means for generating a deflection signal at an amplitude that is related to an amplitude of said deflection current;
   a comparator responsive to a second signal for generating an output signal that is coupled to an electrode of said cathode ray tube to provide beam current blanking when a scan loss condition occurs;
   an active amplifier having an input responsive to said deflection signal for generating said second signal by amplifying the signal that is developed at said input of said amplifier;
   a capacitor coupled to an output of said amplifier; and
   means for generating a current that discharges said capacitor, during a first portion of a given cycle of said deflection signal, wherein said amplifier generates a current that replenishes a charge in said capacitor, during a second portion of said cycle, to generate a capacitor voltage in said capacitor such that, when said scan loss condition occurs, said charge is not replenished to cause said capacitor voltage to cross a threshold level of said comparator.

3. An apparatus according to claim 2 wherein said amplifier generates said capacitor voltage such that said capacitor voltage is larger than a voltage that can be obtained by half-wave rectification of said deflection signal.

4. An apparatus according to claim 2 wherein said discharging current generating means comprises a resistance coupled in parallel with said capacitor.

5. An apparatus according to claim 1 wherein said deflection signal generating means comprises an impedance coupled in series with said deflection winding for generating said deflection signal in said impedance.

6. An apparatus according to claim 5 wherein said impedance comprises a second capacitor that develops thereacross a parabolic voltage.

7. An apparatus according to claim 1, wherein the deflection signal is a parabola at a vertical rate.

8. A television apparatus according to claim 1, wherein said deflection signal generating means comprises a trace capacitor coupled in series with said deflection winding.

9. An apparatus according to claim 1, wherein said active amplifier comprises a transistor operable to conduct a current that is coupled to a capacitor during a portion of a period of the deflection signal for developing said second signal in said capacitor.

10. A video display apparatus, comprising:
   a cathode ray tube including an evacuated glass envelope, a display screen disposed at one end of said envelope and an electron gun assembly disposed at a second end of said envelope, said electron gun assembly producing an electron beam that forms a raster at electron beam landing locations on said screen;
   means for generating a deflection current in a deflection winding that is disposed on said cathode ray tube for producing a deflection field in a beam path of said electron beam;
   means coupled to said deflection current generating means for generating a deflection signal at an amplitude that is related to an amplitude of said deflection current;
   a comparator responsive to a second signal for generating an output signal that is coupled to an electrode of said cathode ray tube to provide beam current blanking when a scan loss condition occurs; and an active amplifier having an input responsive to said deflection signal for generating said second signal by amplifying the signal that is developed at said input of said amplifier wherein said active amplifier comprises a transistor operable to conduct a current that is coupled to a capacitor during a portion of a period of the deflection signal for developing said second signal in said capacitor and wherein said transistor current is coupled from a current supply to said capacitor, during a peak of said deflection signal that occur during a retrace interval.

11. The television apparatus according to claim 10, wherein said transistor is operable to raise a voltage of said capacitor to a predetermined level substantially higher than an amplitude of said deflection signal.

12. An apparatus according to claim 11, wherein said transistor is coupled to a supply voltage and charges said capacitor substantially to a level of said supply voltage.

13. A video display apparatus, comprising:
a cathode ray tube including an evacuated glass envelope, a display screen disposed at one end of said envelope and an electron gun assembly disposed at a second end of said envelope, said electron gun assembly producing an electron beam that forms a raster at electron beam landing locations on said screen;
means for generating a deflection current in a deflection winding that is disposed on said cathode ray tube for producing a deflection field in a beam path of said electron beam;
means coupled to said deflection current generating means for generating a parabolic deflection signal at an amplitude that is related to an amplitude of said deflection current;
a capacitor;
means responsive to said parabolic deflection signal for generating periodic current pulses in said capacitor to develop a voltage in said capacitor such that, during normal operation, a peak level of said voltage in said capacitor is at a constant level independently of said amplitude of said deflection current;
means coupled to said capacitor for discharging said capacitor between said pulses; and
a comparator responsive to said capacitor voltage for generating an output signal that is coupled to an electrode of said cathode ray tube to provide beam current blanking when a scan loss occurs.

14. A video display apparatus, comprising:
a cathode ray tube having a phosphored screen, an electron gun assembly for emitting an electron beam directed against said screen, and a deflection winding for producing one of horizontal and vertical scanning of the electron beam on the screen;
means coupled to said deflection winding for producing a parabolic deflection signal at a frequency that is related to a scanning rate;
means responsive to said parabolic deflection signal for generating DC pulses of substantially constant peak amplitude that is independent of an amplitude of said parabolic deflection signal, said DC pulses occurring at said frequency that is related to said scanning rate;

a capacitor coupled to an output of said DC pulses generating means;
means coupled to said capacitor for discharging said capacitor between said pulses; and
a comparator having a signal input coupled to said second capacitor and the comparator producing an output signal when a level at said signal input crosses a threshold level of said comparator, said output signal of said comparator being coupled to an electrode of said cathode ray tube for triggering blanking of the beam.

15. An apparatus according to claim 14, wherein said deflection signal is generated in a trace capacitor having a parabola waveform with voltage having peaks occurring remote in time from a center of a scan, and wherein said pulses generating means includes a transistor operable to provide narrow DC current pulses to the capacitor during said peaks, whereby the transistor functions as an amplifier and as a rectifier.

16. The television apparatus according to claim 14 further comprising, a second cathode ray tube having a second deflection winding coupled to said trace capacitor, and wherein the comparator is operable to provide beam current blanking of all of said cathode ray tubes.

17. A television apparatus comprising:
a cathode ray tube having a phosphored screen, means for emitting an electron beam against the screen, and deflection yokes for producing deflection of the electron beam on the screen;
a source of a deflection signal for the beam, the deflection signal having an AC component;
an active amplifier with an input coupled to the deflection signal for the beam, and an output, the output having an amplitude exceeding that of the input;
a rectifier coupled to the output of the amplifier, a capacitor coupled in parallel with an output of the rectifier, and a resistance in parallel with the capacitor to discharge the capacitor over time;
a comparator having a signal input coupled to the capacitor and a reference input, the signal input being coupled to the capacitor and the comparator producing an output signal when a level of the signal input crosses that of the reference input, the output signal of the comparator being coupled to the means for emitting the electron beam and triggering blanking of the beam.

18. The television apparatus according to claim 17, wherein the deflection signal is a parabola at a scanning rate of the electron beam.

19. A television apparatus comprising:
a cathode ray tube having a phosphored screen, means for emitting an electron beam against the screen, and deflection yokes for producing deflection of the electron beam on the screen;
a trace capacitor coupled to at least one of the deflection yokes, the trace capacitor producing a voltage signal having an AC component at a scanning rate of the beam;
a pulse generator coupled to the voltage signal of the trace capacitor, the pulse generator providing DC pulses of substantially constant amplitude that is independent of an amplitude of said voltage signal, narrower than a period of the scanning rate, as a function of detection of the AC component in the voltage signal of the trace capacitor;

a capacitor coupled to an output of the pulse generator, and a resistance in parallel with the capacitor for discharging the capacitor between said pulses;

a comparator having a signal input coupled to the capacitor and a reference input, the signal input being coupled to the capacitor and the comparator producing an output signal when a level of the signal input crosses that the reference input, the output signal of the comparator being coupled to the means for emitting the electron beam and triggering blanking of the beam.

* * * * *